United States Patent
Watanabe

(10) Patent No.: US 12,372,309 B2
(45) Date of Patent: Jul. 29, 2025

(54) HEAT SINK

(71) Applicant: Furukawa Electric Co., Ltd., Tokyo (JP)

(72) Inventor: Yosuke Watanabe, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 182 days.

(21) Appl. No.: 18/459,905

(22) Filed: Sep. 1, 2023

(65) Prior Publication Data

US 2023/0408214 A1    Dec. 21, 2023

Related U.S. Application Data

(63) Continuation of application No. PCT/JP2022/013887, filed on Mar. 24, 2022.

(30) Foreign Application Priority Data

Jun. 25, 2021 (JP) ................... 2021-106158

(51) Int. Cl.
*F28D 15/02* (2006.01)
(52) U.S. Cl.
CPC .................. *F28D 15/02* (2013.01)
(58) Field of Classification Search
CPC ........ H01L 23/3672; F28F 13/06; F28F 13/12
See application file for complete search history.

(56) References Cited

U.S. PATENT DOCUMENTS

| | | | |
|---|---|---|---|
| 9,342,110 B2 * | 5/2016 | Wong | G06F 1/1658 |
| 10,921,066 B2 | 2/2021 | Wang | |
| 2003/0094275 A1 | 5/2003 | Mochizuki et al. | |

(Continued)

FOREIGN PATENT DOCUMENTS

| CN | 2833892 Y | 11/2006 |
|---|---|---|
| CN | 1949958 A | 4/2007 |

(Continued)

OTHER PUBLICATIONS

International Search Report and Written Opinion (English translation for ISR only) for International Patent Application No. PCT/JP2022/013887 dated Jun. 21, 2022, pp. all.

(Continued)

*Primary Examiner* — Jianying C Atkisson
*Assistant Examiner* — Khaled Ahmed Ali Al Samiri
(74) *Attorney, Agent, or Firm* — Dorsey & Whitney LLP

(57) ABSTRACT

A heat sink including a plurality of plate-like radiating fins erected on a base plate at a predetermined erection angle $\theta 1$ with respect to an extending direction of the base plate. The radiating fins each has: a fin base portion that extends from one end to another end in a width direction of the radiating fin; a perpendicular portion that extends from one end of the fin base portion to a fin tip portion of the radiating fin on a same plane as the fin base portion; an inclined portion that extends from the perpendicular portion to the other end at a predetermined inclination angle $\theta 2$ with respect to the fin base portion and the perpendicular portion and extends from the fin tip portion to a fin intermediate portion; and a twisted portion that connects the fin base portion, the perpendicular portion, and the inclined portion.

19 Claims, 12 Drawing Sheets

(56) References Cited

U.S. PATENT DOCUMENTS

| | | |
|---|---|---|
| 2003/0155103 A1 | 8/2003 | Barten |
| 2005/0063159 A1 | 3/2005 | Ma |
| 2007/0084595 A1 | 4/2007 | Lin et al. |
| 2010/0073878 A1 | 3/2010 | Zha et al. |
| 2010/0097762 A1 | 4/2010 | Zha et al. |
| 2010/0276135 A1 | 11/2010 | Morino et al. |

FOREIGN PATENT DOCUMENTS

| | | |
|---|---|---|
| CN | 101686628 A | 3/2010 |
| CN | 101730444 A | 6/2010 |
| CN | 101976104 A | 2/2011 |
| CN | 103165548 A | 6/2013 |
| CN | 107359145 A | 11/2017 |
| JP | S6211008 Y2 * | 3/1987 |
| JP | 2001118972 A | 4/2001 |
| JP | 2009147107 A | 7/2009 |
| JP | 2015164166 A | 9/2015 |
| JP | 2016035981 A | 3/2016 |
| TW | 360404 U | 6/1999 |

OTHER PUBLICATIONS

Notice of the Opinion on Examination for Taiwanese Patent Application No. 111114209 dated Nov. 28, 2022, pp. all.

* cited by examiner

HEAT SINK

CROSS REFERENCE TO RELATED APPLICATIONS

The present application is a continuation application of International Patent Application No. PCT/JP2022/013887 filed on Mar. 24, 2022, which claims the benefit of Japanese Patent Application No. 2021-106158, filed on Jun. 25, 2021. The contents of these applications are incorporated herein by reference in their entirety.

BACKGROUND

Technical Field

The present disclosure relates to a heat sink including a radiating fin that cools a heat-generating element such as an electronic component.

Background

Heat-generating elements such as electronic components are being installed in electronic devices at high densities due to enhancement in functionality of the electronic devices. A heat sink may be used as a unit configured to cool heat-generating elements such as electronic components. The cooling performance of the heat sink may be exhibited by performing forced air cooling by a blower fan and the like in the heat sink, in other words, by supplying cooling air to the heat sink.

The heat generation amount of heat-generating elements such as electronic components is increasing due to the enhancement in functionality of electronic devices, and it is becoming increasingly important to improve the cooling performance of the heat sink. Improvement of the fin efficiency of radiating fins is being proposed in order to improve the cooling performance of the heat sink. Thus, a heat sink as follows has been proposed (Japanese Patent Laid-Open No. 2015-164166). In the heat sink, inclination angles of heat dissipation surfaces with respect to one surface portion of a base plate differ between radiating fin groups adjacent to each other in a depth length direction, and end surfaces of the adjacent radiating fin groups intersect each other on a supporting substrate when seen from one side of the depth length direction of the heat sink.

In Japanese Patent Laid-Open No. 2015-164166, the radiating fins are disposed in an offset manner. Therefore, when the cooling air flows into the radiating fin group on the rear side, the cooling air breaks a thermal boundary layer, which has gradually grown in a process of the cooling air passing through the radiating fin group on the front side, by becoming turbulence, and mixes cooling air of low temperature and cooling air of high temperature together. As a result, the cooling air of low temperature is easily caused to contact front surfaces of the radiating fins, and the fin efficiency of the radiating fins is improved.

However, in Japanese Patent Laid-Open No. 2015-164166, the radiating fins are disposed in an offset manner. Therefore, although turbulence is generated in the cooling air when the cooling air passes through the radiating fin groups of which inclination angles of the heat dissipation surfaces differ, the pressure loss of the cooling air increases, the flow of the cooling air is dispersed, and the wind speed of the cooling air between the radiating fins decreases. As a result, in Japanese Patent Laid-Open No. 2015-164166, heat dissipation characteristics of the heat sink may not be sufficiently improved.

The fin efficiency of the radiating fin is defined by Fin Efficiency=(Average Temperature of Radiating Fin−Ambient Temperature)/(Temperature of Fin Base Portion−Ambient Temperature). Therefore, in order to improve the fin efficiency of the radiating fin, the temperature of the fin base portion of the radiating fin that is the closest to the heat-generating element and that becomes the highest in temperature needs approach the average temperature of the radiating fin as much as possible. However, in Japanese Patent Laid-Open No. 2015-164166, out of the radiating fin, the flow rate of the cooling air at the fin base portion that becomes the highest in temperature tends to be less than the flow rate of the cooling air at the fin tip portion that is the farthest from the heat-generating element and that becomes the lowest in temperature due to the presence of the base plate, and hence the fin base portion easily becomes high in temperature. Therefore, in Japanese Patent Laid-Open No. 2015-164166, the temperature of the fin base portion of the radiating fin becomes extremely higher than the average temperature of the radiating fin, and excellent fin efficiency still cannot be obtained.

In electronic devices, heat-generating elements such as electronic components are installed at high densities, and the installable volume for the heat sink is limited. Therefore, it is difficult to improve the heat dissipation characteristics of the heat sink by increasing the surface area of each of the radiating fins. When the number of installations of the radiating fins is increased instead of increasing the surface area of each of the radiating fins, the pressure loss of the cooling air increases, and the wind speed of the cooling air between the radiating fins decreases. Even when the wind speed of the cooling air is increased in order to make up for the increase of the pressure loss of the cooling air, the difference between the temperature of the fin base portion of the radiating fin and the average temperature of the radiating fin increases, and excellent fin efficiency still cannot be obtained.

SUMMARY

The present disclosure is related to providing a heat sink in which excellent fin efficiency is obtainable by reducing a difference between the temperature of a fin base portion of a radiating fin and an average temperature of the radiating fin as a result of the flow rate of cooling air at a fin base portion becoming faster than the flow rate of cooling air at a fin tip portion of a radiating fin, turbulence is generatable in the cooling air, the increase of a pressure loss of the cooling air is preventable, and the decrease of the wind speed of cooling air between the radiating fins is preventable.

A gist of a configuration of the present disclosure is as follows.

{1} A heat sink including:
  a base plate thermally connected to a heat-generating element; and
  a plurality of plate-like radiating fins erected on a main front surface of the base plate at a predetermined erection angle θ1 with respect to an extending direction of the main front surface of the base plate and thermally connected to the base plate, wherein the radiating fins each have:
    a fin base portion that is a planar surface portion that extends from one end to another end in a width direction of the radiating fin along the main front surface of the base plate and is positioned on the base plate side;

a perpendicular portion that is a planar surface portion that extends from one end of the fin base portion to a fin tip portion of the radiating fin in a height direction on a same plane as the fin base portion;

an inclined portion that is a planar surface portion that extends from the perpendicular portion to the other end at a predetermined inclination angle θ2 with respect to the fin base portion and the perpendicular portion and extends from the fin tip portion to a fin intermediate portion between the fin tip portion and the fin base portion; and a twisted portion that is a planar surface portion that connects the fin base portion, the perpendicular portion, and the inclined portion to each other.

{2} The heat sink according to {1}, wherein the inclination angle θ2 is 2.0 degrees or more and 20 degrees or less.

{3} The heat sink according to {1} or {2}, wherein the erection angle θ1 of the fin base portion is 70 degrees or more and 90 degrees or less.

{4} The heat sink according to any one of {1} to {3}, wherein a top surface portion having a planar surface shape further extends from the fin tip portion in the perpendicular portion.

{5} The heat sink according to {4}, wherein a top surface of a radiating fin group formed by the plurality of radiating fins has an opening portion as a result of the top surface portion abutting against the fin tip portion of another adjacent one of the radiating fins.

{6} The heat sink according to any one of {1} to {4}, wherein a bottom surface portion having a planar surface shape further extends from a bottom portion of the fin base portion.

{7} The heat sink according to any one of {1} to {6}, wherein a height of the fin base portion with respect to a height of the radiating fin is 5.0% or more and 40% or less.

{8} The heat sink according to any one of {1} to {7}, wherein a width of the twisted portion with respect to a width of the radiating fin is 50% or more and 90% or less.

{9} The heat sink according to any one of {1} to {8}, wherein a plurality of the radiating fins are disposed along a width direction of the fin base portion, and one end of the fin base portion contacts another end of the fin base portion of the adjacent radiating fin via a joining portion.

{10} The heat sink according to any one of {1} to {9}, wherein the base plate is a thermally conductive member.

{11} The heat sink according to any one of {1} to {10}, wherein the radiating fin includes a multistage structure having a first radiating fin, and a second radiating fin stacked on the first radiating fin in a height direction of the first radiating fin, the first radiating fin is thermally connected to the base plate via a heat transportation member, and the second radiating fin is thermally connected to the heat transportation member.

{12} The heat sink according to {10}, wherein a gap portion is formed between a fin tip portion of the first radiating fin and the heat transportation member.

{13} The heat sink according to {11} or {12}, wherein a heat insulating material is interposed between a fin tip portion of the first radiating fin and the heat transportation member.

{14} The heat sink according to any one of {11} to {13}, wherein the heat transportation member is a heat pipe having a tubular container or a vapor chamber having a planar-surface-type container.

{15} The heat sink according to {10}, wherein the base plate is a thermally conductive member formed by the heat transportation member.

{16} The heat sink according to any one of {1} to {15}, wherein cooling air is supplied from the perpendicular portion side along the width direction of the radiating fin.

According to an aspect of the heat sink of the present disclosure, the radiating fin has the fin base portion that is the planar surface portion that extends from one end to the other end in the width direction of the radiating fin along the main front surface of the base plate, the perpendicular portion that is the planar surface portion that extends on the same plane as the fin base portion from one end of the fin base portion to the fin tip portion in the height direction of the radiating fin, the inclined portion that is the planar surface portion that extends at the predetermined inclination angle θ2 with respect to the fin base portion and the perpendicular portion from the perpendicular portion to the other end of the radiating fin in the width direction and extends from the fin tip portion to the fin intermediate portion between the fin tip portion and the fin base portion, and the twisted portion that is the planar surface portion that connects the fin base portion, the perpendicular portion, and the inclined portion to each other. As a result, the inclined portion and the twisted portion guide the cooling air in the direction from the fin tip portion to the fin base portion, and the flow rate of the cooling air at the fin base portion of the radiating fin becomes faster than the flow rate of the cooling air at the fin tip portion of the radiating fin. Therefore, the difference between the temperature of the fin base portion and the average temperature of the radiating fin can be reduced, and excellent fin efficiency can be obtained. According to an aspect of the heat sink of the present disclosure, the radiating fin has the inclined portion and the twisted portion described above. As a result, even when the radiating fins are not disposed in an offset manner, the cooling air is smoothly sent to the adjacent radiating fins that are parallelly disposed. Therefore, turbulence can be generated in the cooling air, the increase of the pressure loss of the cooling air can be prevented, and the decrease of the wind speed of the cooling air between the radiating fins can be prevented. Therefore, the heat sink of the present disclosure can exhibit excellent heat dissipation characteristics.

According to an aspect of the heat sink of the present disclosure, the inclination angle θ2 of the inclined portion with respect to the fin base portion and the perpendicular portion is 2.0 degrees or more and 20 degrees or less. As a result, the inclined portion and the twisted portion can guide the cooling air in the direction from the fin tip portion to the fin base portion in a more reliable manner, the increase of the pressure loss of the cooling air can be prevented in a more reliable manner, and the decrease of the wind speed of the cooling air between the radiating fins can be prevented in a more reliable manner.

According to an aspect of the heat sink of the present disclosure, the erection angle θ1 of the fin base portion with respect to the main front surface of the base plate is 70 degrees or more and 90 degrees or less. As a result, the number of installations of the radiating fins in the space in which the radiating fins are installable can be reliably secured, and the inclined portion and the twisted portion can guide the cooling air in the direction from the fin tip portion to the fin base portion in a more reliable manner.

According to an aspect of the heat sink of the present disclosure, the top surface portion having the planar surface shape further extends from the fin tip portion in the perpendicular portion. As a result, the mechanical strength of the radiating fin group formed by the plurality of radiating fins improves by causing the top surface portion to abut against the adjacent radiating fin.

According to an aspect of the heat sink of the present disclosure, the top surface of the radiating fin group formed by the plurality of radiating fins has the opening portion as a result of the top surface portion abutting against the fin tip portion of another adjacent one of the radiating fins. As a result, the flow of the cooling air into the radiating fin group can be facilitated, and the increase of the pressure loss of the cooling air can be prevented.

According to an aspect of the heat sink of the present disclosure, the bottom surface portion having a planar surface shape further extends from the bottom portion of the fin base portion. As a result, the thermally connectivity between the base plate and the radiating fin improves, and the mechanical strength of the radiating fin group formed by the plurality of radiating fins improves by causing the bottom surface portion to abut against the adjacent radiating fin.

According to an aspect of the heat sink of the present disclosure, the height of the fin base portion to the height of the radiating fin is 5.0% or more and 40% or less. As a result, the cooling air can be guided in the direction from the fin tip portion to the fin base portion in a more reliable manner, the increase of the pressure loss of the cooling air can be prevented in a more reliable manner, and the decrease of the wind speed of the cooling air between the radiating fins can be prevented in a more reliable manner.

According to an aspect of the heat sink of the present disclosure, the width of the twisted portion to the width of the radiating fin is 50% or more and 90% or less. As a result, the cooling air can be guided in the direction from the fin tip portion to the fin base portion in a more reliable manner, the increase of the pressure loss of the cooling air can be prevented in a more reliable manner, and the decrease of the wind speed of the cooling air between the radiating fins can be prevented in a more reliable manner.

According to an aspect of the heat sink of the present disclosure, the radiating fin includes the multistage structure having the first radiating fin, and the second radiating fin stacked on the first radiating fin in the height direction of the first radiating fin, the first radiating fin is thermally connected to the base plate via the heat transportation member, and the second radiating fin is thermally connected to the heat transportation member. As a result, an aspect in which the radiating fin is divided in the height direction is obtained, and heat is transported from the base plate to the second radiating fin by the heat transportation member. Therefore, the fin efficiency of the radiating fin further improves.

According to an aspect of the heat sink of the present disclosure, the heat insulating material is interposed between the fin tip portion of the first radiating fin and the heat transportation member. As a result, the condensation portion of the heat transportation member can be prevented from rising in temperature by the first radiating fin, and the reduction of the temperature difference between the evaporation portion and the condensation portion of the heat transportation member can be suppressed. Therefore, heat transportation characteristics of the heat transportation member improve. As a result of the heat transportation characteristics of the heat transportation member improving, the heat transportation from the first radiating fin to the second radiating fin is facilitated, and the fin efficiency of the radiating fin further improves.

DETAILED DESCRIPTION

Figure 1:
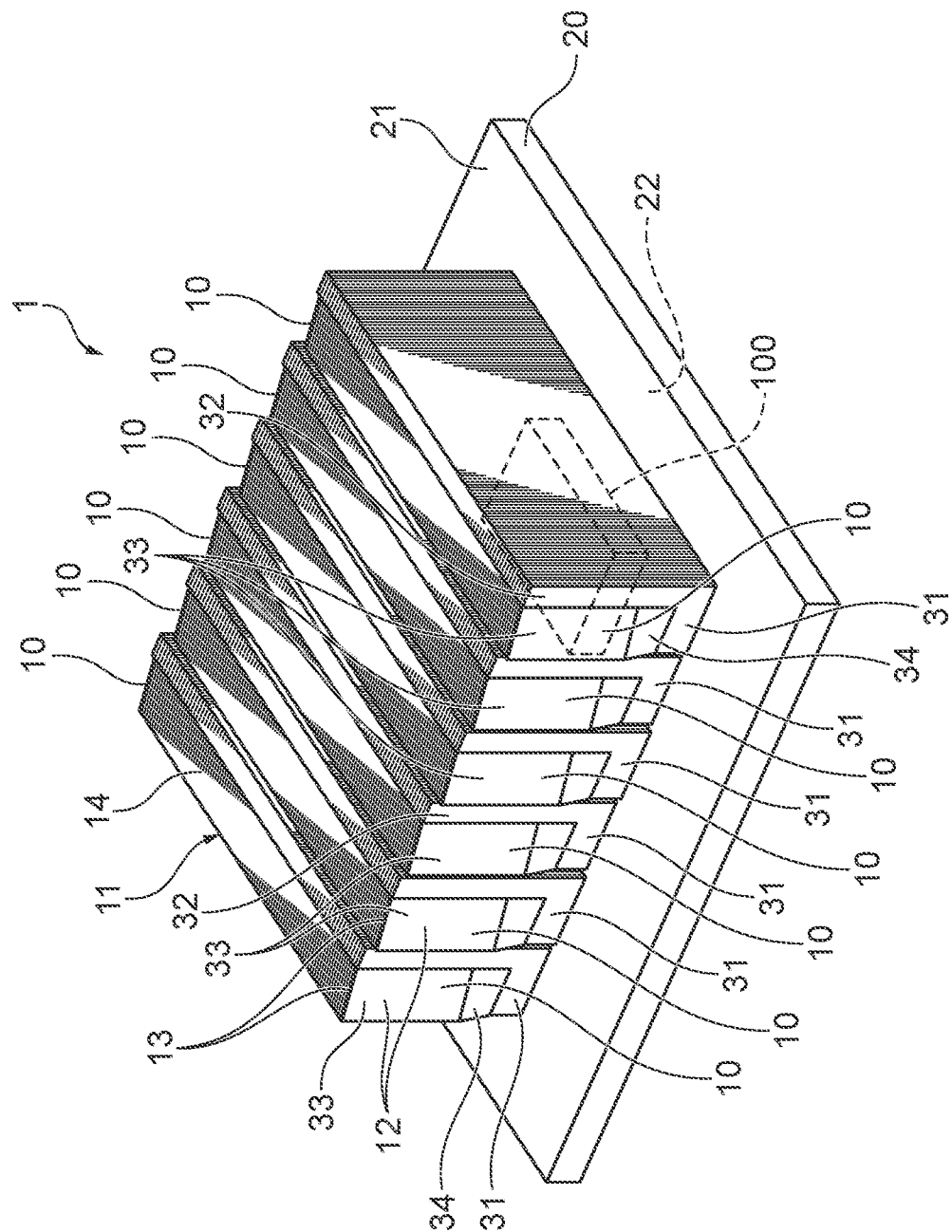
FIG. 1 is a perspective view of a heat sink according to a first embodiment of the present disclosure.
Figure 2:
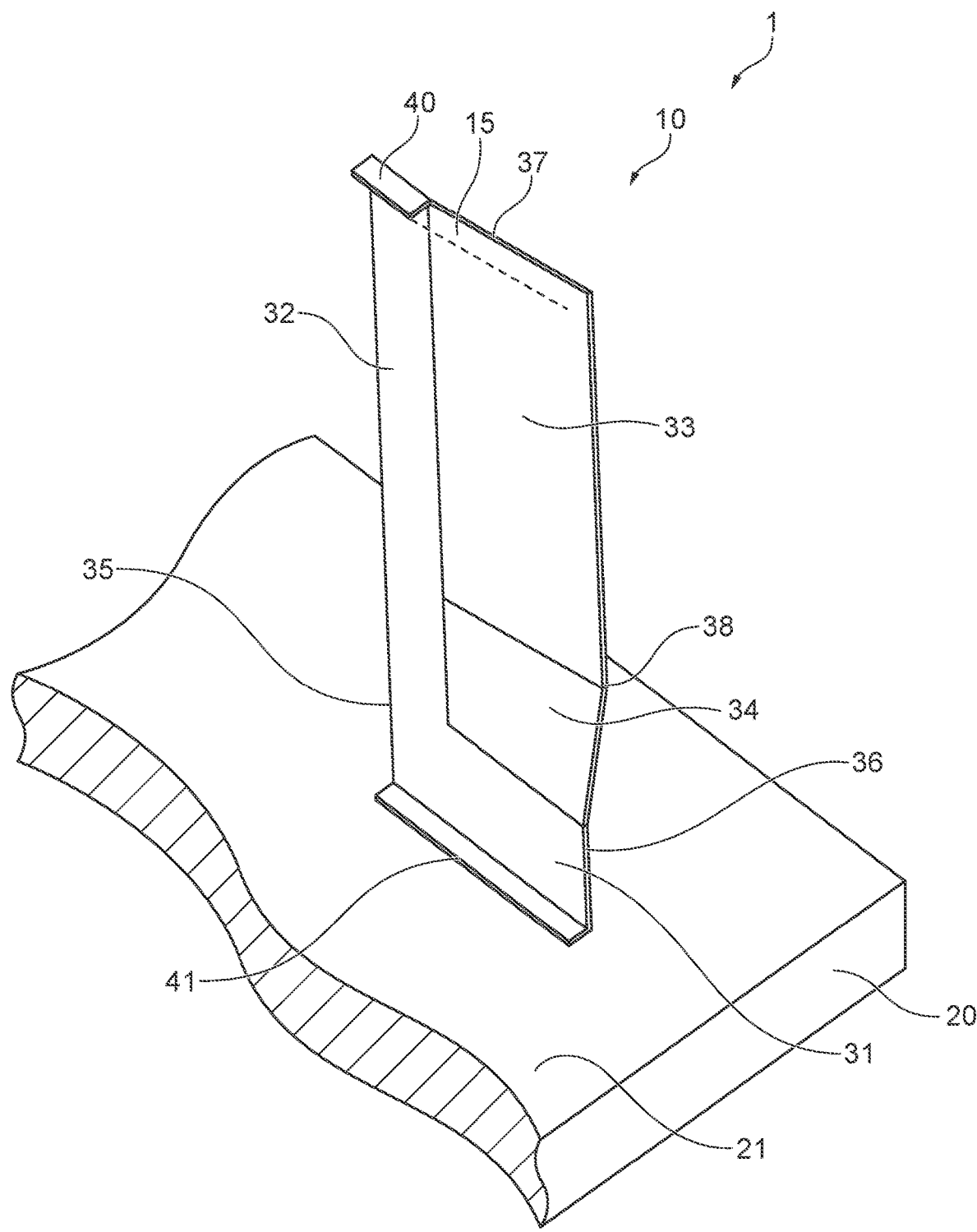
FIG. 2 is a perspective view of a radiating fin included in the heat sink according to the first embodiment of the present disclosure.
Figure 3:
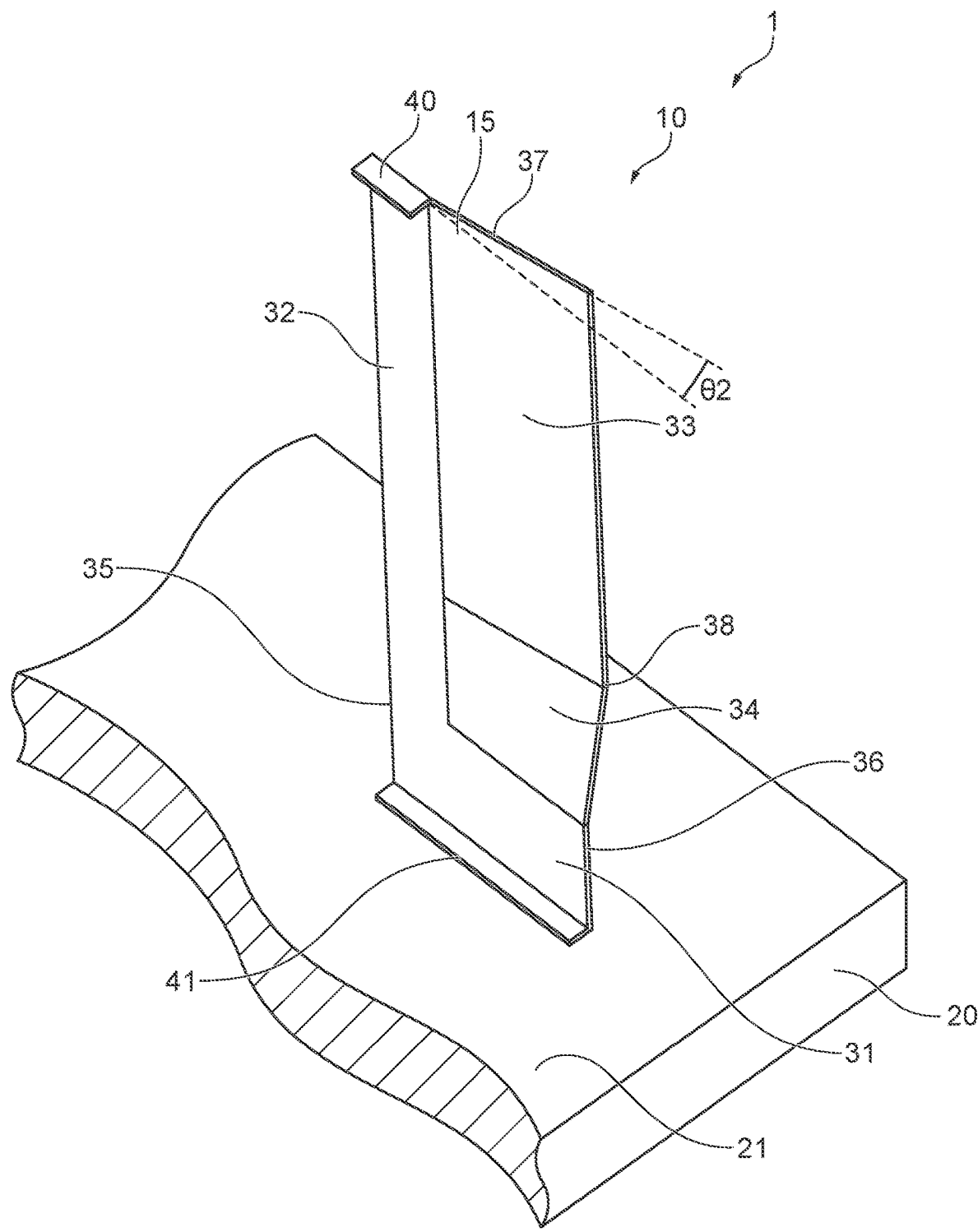
FIG. 3 is an explanatory view illustrating an inclination angle θ2 of an inclined portion of the radiating fin included in the heat sink according to the first embodiment of the present disclosure.
Figure 4:
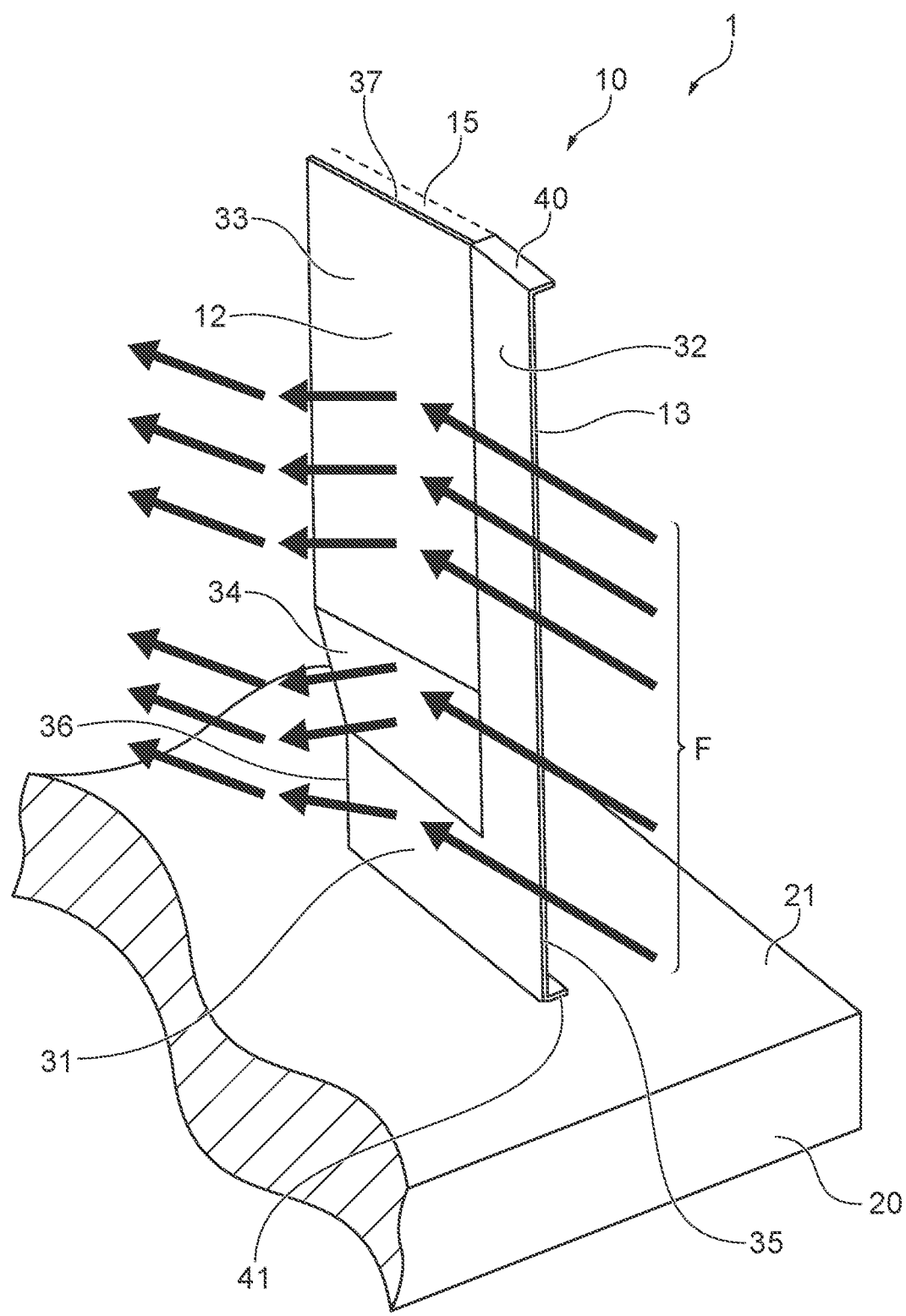
FIG. 4 is an explanatory view illustrating the flow of cooling air in the radiating fin included in the heat sink according to the first embodiment of the present disclosure.
Figure 5:
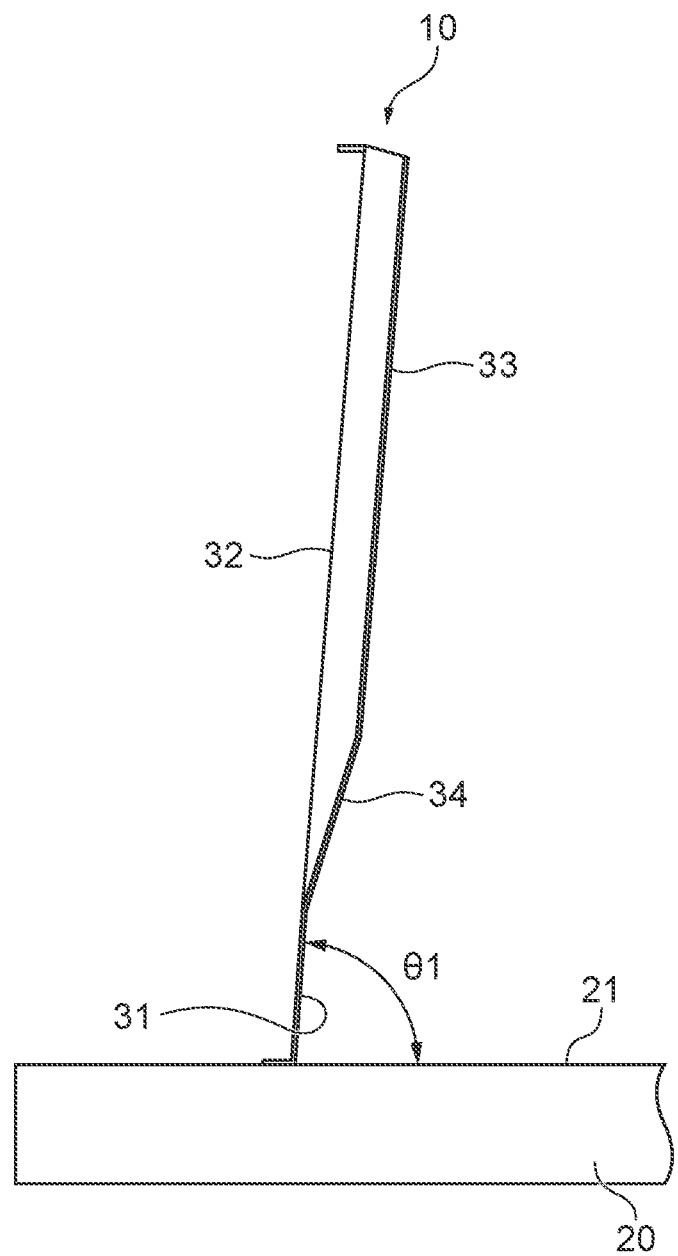
FIG. 5 is an explanatory view illustrating an erection angle θ1 of the radiating fin included in the heat sink according to the first embodiment of the present disclosure.

Hereinafter, a heat sink according to a first embodiment of the present disclosure will be described with reference to the accompanying drawings. FIG. 1 is a perspective view of the heat sink according to the first embodiment of the present disclosure. FIG. 2 is a perspective view of a radiating fin included in the heat sink according to the first embodiment of the present disclosure. FIG. 3 is an explanatory view illustrating an inclination angle θ2 of an inclined portion of the radiating fin included in the heat sink according to the first embodiment of the present disclosure. FIG. 4 is an explanatory view illustrating the flow of cooling air in the radiating fin included in the heat sink according to the first embodiment of the present disclosure. FIG. 5 is an explanatory view illustrating an erection angle θ1 of the radiating fin included in the heat sink according to the first embodiment of the present disclosure.

As illustrated in FIG. 1, a heat sink 1 according to the first embodiment includes a base plate 20 having a flat-plate-like shape, and a plurality of radiating fins 10, 10, 10 . . . that are erected on the base plate 20 and each have a plate-like shape. The radiating fins 10 are directly attached to a main front surface 21 of the base plate 20, and hence the radiating fins 10 are thermally connected to the base plate 20. The radiating fins 10 are thermally connected to the base plate 20 by being erected on the main front surface 21 of the base plate 20 at a predetermined erection angle θ1 with respect to an extending direction of the main front surface 21 of the base plate 20. The plurality of radiating fins 10, 10, 10 . . . form a radiating fin group 11 by being parallelly disposed on the main front surface 21 of the base plate 20.

The base plate 20 is thermally connected to a heat-generating element 100 that is a cooling target. The heat-generating element 100 abuts against a heat receiving surface 22 of the base plate 20 opposite from the main front surface 21. As a result, the base plate 20 is thermally connected to the heat-generating element 100. The base plate 20 is formed by a thermally conductive member. As the thermally conductive member, metal members of copper and copper alloy, for example, can be listed.

The radiating fin 10 has a thin flat-plate-like shape and has main front surfaces 12 and side surfaces 13. In the radiating fin 10, the main front surfaces 12 mainly contribute to the heat dissipation of the radiating fin 10. The width of the side surface 13 forms the thickness of the radiating fin 10. The material of the radiating fin 10 is not particularly limited, and copper, copper alloy, aluminum, and aluminum alloy, for example, can be listed.

As illustrated in FIG. 1, the plurality of radiating fins 10, 10, 10 . . . are parallelly disposed in a direction substantially parallel to the extending direction of the main front surfaces 12 of the plurality of radiating fins 10, 10, 10 . . . and such that the main front surfaces 12, 12, 12 . . . of the plurality of radiating fins 10, 10, 10 . . . are substantially on the same plane. More specifically, as described below, fin base portions 31, 31, 31 . . . of the plurality of radiating fins 10, 10, 10 . . . are parallelly disposed such that the fin base portions 31, 31, 31 . . . are in a substantially parallel direction and substantially on the same plane. The plurality of radiating fins 10, 10, 10 . . . are parallelly disposed to substantially be on a straight line in a direction substantially orthogonal to the extending direction of the main front surfaces 12 of the plurality of radiating fins 10, 10, 10 . . . . More specifically, as described below, the fin base portions 31, 31, 31 . . . of the plurality of radiating fins 10, 10, 10 . . . are parallelly disposed to substantially be on a straight line in a direction substantially orthogonal to the extending direction of the fin base portions 31, 31, 31 . . . . From the above, the main front surface 12 of the radiating fin 10 is disposed to be arranged to be substantially parallel to the main front surface 12 of another adjacent radiating fin 10. Therefore, the plurality of radiating fins 10, 10, 10 . . . are disposed in an aligned manner and are not disposed in an offset manner. The plurality of radiating fins 10, 10, 10 . . . forming the heat sink 1 are parallelly disposed at substantially even intervals from one end to another end of the base plate 20.

As illustrated in FIGS. 1, 2, and 3, the main front surface 12 of the radiating fin has a plurality of regions of which extending directions of planar surface portions differ. The main front surface 12 of the radiating fin 10 has, as a plurality of regions of which extending directions of the planar surface portions differ, the fin base portion 31, a perpendicular portion 32 positioned on the same plane as the fin base portion 31, an inclined portion 33 inclined with respect to the fin base portion 31 and the perpendicular portion 32, and a twisted portion 34 that is a region other than the fin base portion 31, the perpendicular portion 32, and the inclined portion 33.

The fin base portion 31 is a planar surface portion that extends from one end to another end 36 in the width direction of the radiating fin 10 along the main front surface 21 of the base plate 20 and is positioned on the base plate 20 side. The fin base portion 31 is a connecting portion of the radiating fin 10 with respect to the base plate 20, and the radiating fin 10 is attached to the base plate 20 by the fin base portion 31. The fin base portion 31 is a flat surface. In the radiating fin 10, the fin base portion 31 extends with a substantially constant height from one end 35 to the other end 36 in the width direction of the radiating fin 10.

The perpendicular portion 32 is a planar surface portion that extends from one end 35 of the fin base portion 31 to a fin tip portion 37 in the height direction of the radiating fin 10 on the same plane as the fin base portion 31. The perpendicular portion 32 is a region that is continuous from the fin base portion 31 and stretches in a direction perpendicular to the fin base portion 31. The extending direction of the perpendicular portion 32 is the same as the extending direction of the fin base portion 31. The perpendicular portion 32 is positioned on one end 35 in the width direction of the radiating fin 10 and does not stretch to the other end 36 in the width direction of the radiating fin 10. The perpendicular portion 32 is a flat surface. In the radiating fin 10, the perpendicular portion 32 extends with a substantially constant width from the fin base portion 31 to the fin tip portion 37.

The inclined portion 33 is a planar surface portion that extends from the perpendicular portion 32 to the other end 36 and extends from the fin tip portion 37 to a fin intermediate portion 38 between the fin tip portion 37 and the fin base portion 31 at a predetermined inclination angle θ2 with respect to the fin base portion 31 and the perpendicular portion 32. The inclined portion 33 is continuous from the perpendicular portion 32 and is not continuous from the fin base portion 31. The inclined portion 33 is a region inclined at the predetermined inclination angle θ2 with respect to the fin base portion 31 and the perpendicular portion 32, and hence the extending direction of the inclined portion 33 is different from the extending direction of the fin base portion 31 and the perpendicular portion 32. The inclined portion 33 is positioned on the other end 36 in the width direction of the radiating fin 10 and does not stretch to one end 35 in the width direction of the radiating fin 10. The inclined portion 33 is a flat surface. In the radiating fin 10, the inclined portion 33 extends with a substantially same width from the fin tip portion 37 to the fin intermediate portion 38.

The twisted portion 34 is a planar surface portion that connects the fin base portion 31, the perpendicular portion 32, and the inclined portion 33 to each other. The twisted portion 34 is continuous from all of the fin base portion 31, the perpendicular portion 32, and the inclined portion 33, different from the extending direction of the fin base portion 31 and the perpendicular portion 32, and also different from the extending direction of the inclined portion 33. The twisted portion 34 is positioned on the other end 36 in the width direction of the radiating fin 10 and does not stretch to one end 35 in the width direction of the radiating fin 10. The twisted portion 34 is positioned in the fin intermediate portion 38.

As illustrated in FIG. 4, cooling air F supplied to the heat sink 1 from a blower fan (not shown) is supplied so as to circulate in a direction from one end 35 to the other end 36 of the radiating fin 10. In other words, the cooling air F is supplied from the perpendicular portion 32 side along the width direction of the radiating fin 10. As a result of the cooling air F being supplied to the heat sink 1, the heat sink 1 can exhibit excellent cooling performance. The cooling air F is supplied to the heat sink 1 from the side that faces the side surface 13 of the radiating fin 10 in the perpendicular portion 32 so as to be along the main front surface 21 of the base plate 20, in other words, supplied to a space formed between the main front surfaces 12 of the adjacent radiating fin 10. The cooling air F supplied to the heat sink 1 cools the heat sink 1 by circulating along the main front surface 12 of the radiating fin 10 in the extending direction of the main front surface 21 of the base plate 20.

As illustrated in FIG. 4, in the radiating fin 10 of the heat sink 1, the inclined portion 33 of which extending direction is different from the extending direction of the fin base portion 31 and the perpendicular portion 32, and the twisted portion 34 of which extending direction is different from the extending direction of the fin base portion 31 and the perpendicular portion 32 and also different from the extending direction of the inclined portion 33 guide the cooling air F in a direction from the fin tip portion 37 to the fin base portion 31. As a result of the cooling air F being guided in the direction from the fin tip portion 37 to the fin base portion 31, the flow rate of the cooling air F at the fin base portion 31 of the radiating fin 10 becomes faster than the flow rate of the cooling air F at the fin tip portion 37. Out of the radiating fin 10, the flow rate of the cooling air F at the fin base portion 31 that is the closest to the base plate 20 and most likely becomes high in temperature is fast, and the flow rate of the cooling air F at the fin tip portion 37 that is the farthest from the base plate 20 and least likely becomes high in temperature is moderately suppressed. As a result, the difference between the temperature of the fin base portions 31 and the average temperature of the entire radiating fin 10 is reduced, and hence excellent fin efficiency is obtained.

As illustrated in FIG. 4, as a result of the radiating fin 10 of the heat sink 1 having the inclined portion 33 and the twisted portion 34, the cooling air F is easily separated from the main front surface 12 of the radiating fin 10 because the inclined portion 33 and the twisted portion 34 are sections protruding with respect to the fin base portion 31 and the perpendicular portion 32. Therefore, even when the radiating fins 10 are not disposed in an offset manner and are disposed in an aligned manner, the cooling air F is smoothly sent from the radiating fin 10 to another adjacent radiating fin 10. From the above, in the radiating fin 10 of the heat sink 1, turbulence can be generated in the cooling air F, the increase of pressure loss of the cooling air F can be prevented, and the decrease of the wind speed of the cooling air F between the plurality of radiating fins 10, 10, 10 . . . can be prevented. As a result, the heat sink 1 can exhibit excellent heat dissipation characteristics.

The inclination angle θ2 of the inclined portion 33 with respect to the fin base portion 31 and the perpendicular portion 32 is not particularly limited as long as the inclination angle θ2 exceeds 0 degrees, but a lower limit value of the inclination angle θ2 is preferably 2.0 degrees, more preferably 3.0 degrees, and particularly preferably degrees in terms of the inclined portion 33 and the twisted portion 34 being able to reliably guide the cooling air F in the direction from the fin tip portion 37 to the fin base portion 31. Meanwhile, an upper limit value of the inclination angle θ2 is preferably 20 degrees, more preferably 15 degrees, and particularly preferably 10 degrees in terms of being able to prevent the decrease of the wind speed of the cooling air F between the plurality of radiating fins 10, 10, 10 . . . in a more reliable manner by preventing the increase of the pressure loss of the cooling air F in a more reliable manner.

As illustrated in FIGS. 1 to 4, in the radiating fin 10 of the heat sink 1, a top surface portion 40 having a planar surface shape extends from the fin tip portion 37 in the perpendicular portion 32. The top surface portion 40 extends in a vertical direction with respect to the perpendicular portion 32. As a result of the top surface portion 40 extending from the fin tip portion 37, the mechanical strength of the radiating fin group 11 formed by the plurality of radiating fins 10, 10, 10 . . . improves by causing the top surface portion 40 of the radiating fin 10 to abut against the fin tip portion 37 of another adjacent radiating fin 10.

As a result of the top surface portion 40 of the radiating fin 10 abutting against the fin tip portion 37 of the other adjacent radiating fin 10, a top surface 14 of the radiating fin group 11 formed by the plurality of radiating fins 10, 10, 10 . . . has opening portions 15. The fin tip portions 37 of the inclined portions 33 form the opening portions 15 in the top surface 14 of the radiating fin group 11. As a result of the top surface 14 of the radiating fin group 11 having the opening portions 15, the flow of the cooling air F into the radiating fin group 11 can be facilitated, and the increase of the pressure loss of the cooling air F can be prevented. In this case, the dimension of the top surface portion 40 of the radiating fin 10 in the extending direction defines the width between the radiating fin 10 and another adjacent radiating fin 10. The main function of the top surface portion 40 of the radiating fin 10 is to improve the mechanical strength of the radiating fin group 11, and hence the top surface portion 40 does not necessarily need to be provided in terms of improving the fin efficiency of the radiating fin 10.

As illustrated in FIGS. 1 to 4, in the radiating fin 10 of the heat sink 1, a bottom surface portion 41 having a planar surface shape extends from a bottom portion of the fin base portion 31. The bottom surface portion 41 is provided from one end 35 to the other end 36 of the radiating fin 10. The bottom surface portion 41 extends in a vertical direction with respect to the fin base portion 31. As a result of the bottom surface portion 41 extending from the fin base portion 31, thermal connectivity between the base plate 20 and the radiating fin 10 improves. In addition, the mechanical strength of the radiating fin group 11 formed by the plurality of radiating fins 10, 10, 10 . . . improves by causing the bottom surface portion 41 to abut against another adjacent radiating fin 10.

In the heat sink 1, the plurality of radiating fins 10, 10, 10 . . . are parallelly disposed such that the fin base portions 31 are substantially on the same plane in a direction substantially parallel to the width direction of the fin base portions 31. The plurality of radiating fins 10, 10, 10 . . . are parallelly disposed to substantially be on a straight line in a direction substantially orthogonal to the width direction of the fin base portions 31. In the heat sink 1, one end 35 of the fin base portion 31 does not contact the other end 36 of the fin base portion 31 of another adjacent radiating fin 10. Regarding the plurality of radiating fins 10, 10, 10 . . . parallelly disposed in a direction substantially parallel to the width direction of the fin base portions 31, a gap is formed between the fin base portion 31 of the radiating fin 10 and the fin base portion 31 of another adjacent radiating fin 10.

The ratio of the height of the fin base portion 31 to the height of the radiating fin 10 is not particularly limited, but a lower limit value of the ratio is preferably 5.0% and particularly preferably 10% when the height of the radiating fin 10 is 100% in terms of guiding the cooling air F in the direction from the fin tip portion 37 to the fin base portion 31 in a more reliable manner. Meanwhile, an upper limit value of the ratio of the height of the fin base portion 31 to the height of the radiating fin 10 when the height of the radiating fin 10 is 100% is preferably 40% and particularly preferably 30% in terms of being able to prevent the increase of the pressure loss of the cooling air F in a more reliable manner and prevent the decrease of the wind speed of the cooling air F between the radiating fin 10 and the radiating fin 10 in a more reliable manner.

The ratio of the width of the twisted portion 34 to the width of the radiating fin is not particularly limited, but a lower limit value of the ratio is preferably 50% and particularly preferably 60% when the width of the radiating fin 10 is 100% in terms of guiding the cooling air F in the direction from the fin tip portion 37 to the fin base portion 31 in a more reliable manner. Meanwhile, an upper limit value of the ratio of the width of the twisted portion 34 to the width of the radiating fin 10 when the width of the radiating fin 10 is 100% is preferably 90% and particularly preferably 80% in terms of being able to prevent the increase of the pressure loss of the cooling air F in a more reliable manner and prevent the decrease of the wind speed of the cooling air F between the radiating fin 10 and the radiating fin 10 in a more reliable manner. The width of the twisted portion 34 means the width of the twisted portion 34 in a direction parallel to the planar surface direction of the fin base portion 31 and the perpendicular portion 32.

As illustrated in FIG. 5, the radiating fin 10 is erected on the main front surface 21 of the base plate 20 at the predetermined erection angle θ1 with respect to the extending direction of the main front surface 21 of the base plate 20. The erection angle θ1 of the fin base portion 31 of the radiating fin 10 with respect to the extending direction of the main front surface 21 of the base plate 20 is not particularly limited, but a lower limit value of the erection angle θ1 is preferably 70 degrees and particularly preferably 80 degrees in terms of reliably securing the number of installations of the radiating fins 10 in a space in which the radiating fins 10 are installable. Meanwhile, it is preferred that an upper limit value of the erection angle θ1 be 90°, in other words, the radiating fin 10 be erected such that the fin base portion 31 becomes perpendicular to the main front surface 21 of the base plate 20. The erection angle θ1 means an erection angle of the fin base portion 31 with respect to the extending direction of the base plate 20 in the main front surface 12 on the side on which the inclined portion 33 and the twisted portion 34 protrude with respect to the fin base portion 31 and the perpendicular portion 32 out of both of the main front surfaces 12 of the radiating fin 10.

Figure 6:
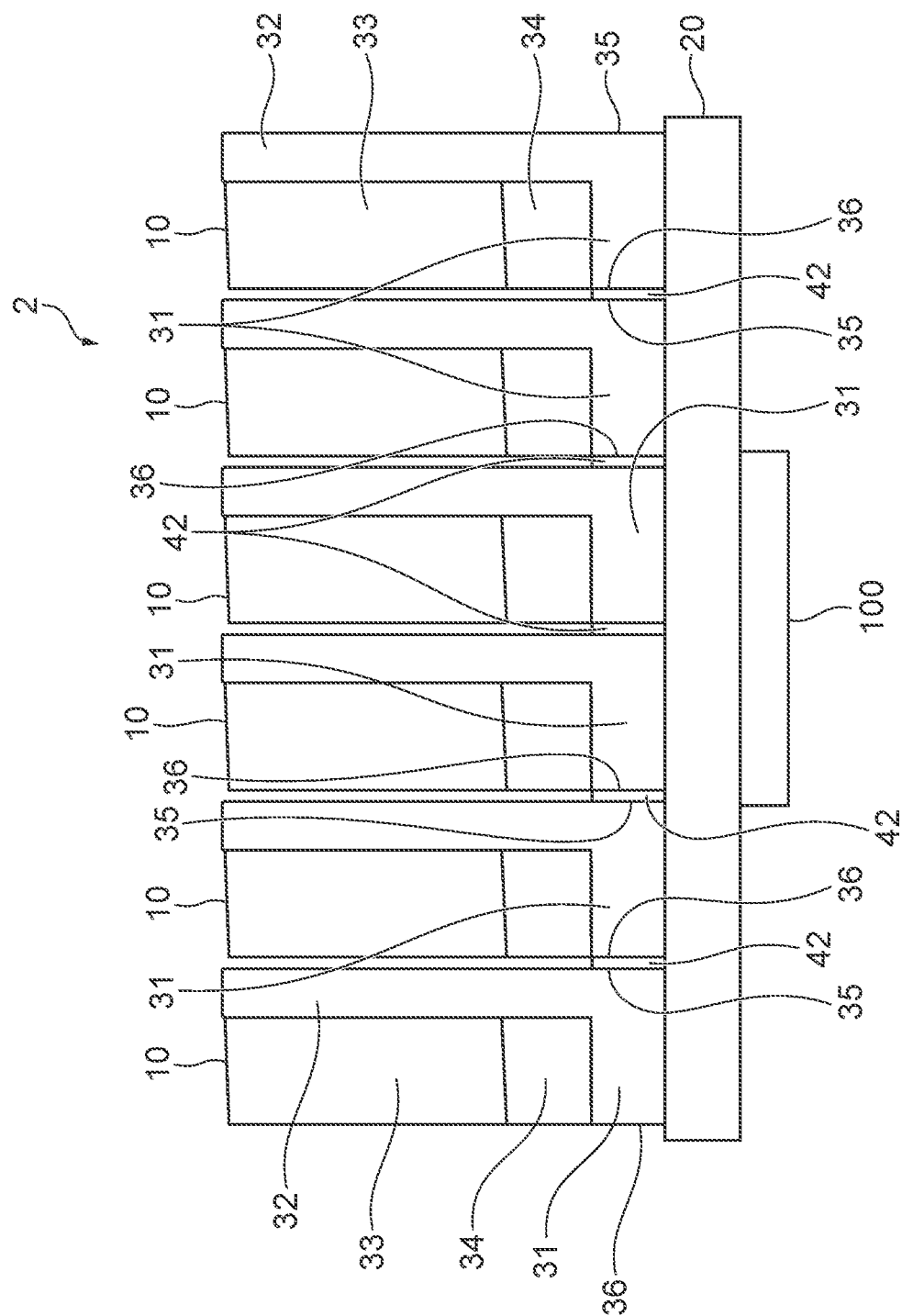
FIG. 6 is a front view of a heat sink according to a second embodiment of the present disclosure.

Next, a heat sink according to a second embodiment of the present disclosure will be described with reference to the accompanying drawings. The heat sink according to the second embodiment is in common with the heat sink according to the first embodiment in terms of main components, and hence the same components as those of the heat sinks according to the first embodiment are described with use of the same reference characters. FIG. 6 is a front view of the heat sink according to the second embodiment of the present disclosure.

In the heat sink 1 according to the first embodiment, one end 35 of the fin base portion 31 does not contact the other end 36 of the fin base portion 31 of another adjacent radiating fin 10. However, as illustrated in FIG. 6, in a heat sink 2 according to the second embodiment, a plurality of the radiating fins 10, 10, 10 . . . are disposed along the width direction of the fin base portions 31, one end 35 of the fin base portion 31 contacts the other end 36 of the fin base portion 31 of another adjacent radiating fin 10 via a joining portion 42, and the plurality of radiating fins 10, 10, 10 . . . disposed along the width direction of the fin base portions 31 are integrated. Therefore, regarding the plurality of radiating fins 10, 10, 10 . . . parallelly disposed in a direction substantially parallel to the width direction of the fin base portions 31, a gap is not formed between the fin base portion 31 of the radiating fin 10 and the fin base portion 31 of another adjacent radiating fin 10.

In the heat sink 2, as a result of the plurality of radiating fins 10, 10, 10 . . . parallelly disposed in a direction substantially parallel to the width direction of the fin base portions 31 contacting each other at the fin base portion 31 of each of the plurality of radiating fins 10, 10, 10 . . . via the joining portion 42, the flow rate of the cooling air at the fin base portions 31 between the plurality of radiating fins 10, 10, 10 . . . parallelly disposed in the direction substantially parallel to the width direction of the fin base portions 31 can be increased. When the joining portion 42 is not provided between the fin base portions 31 of the adjacent radiating fins 10, dispersion tends to occur more in the cooling air at the fin base portion 31 placed to the downstream side of the cooling air. However, as a result of the joining portion 42 being provided between the fin base portions 31 of the adjacent radiating fins 10, a fast flow rate of the cooling air at the fin base portion 31 can be maintained in a further reliable manner. The joining portion 42 may be integrally molded with the fin base portion 31 or may be formed with use of a joining member that is a member separate from the fin base portion 31. When the joining portion 42 is formed with use of the joining member, an aspect in which the fin base portions 31 of the adjacent radiating fins 10 are joined to each other by the joining member is obtained. As the joining member, for example, solder and the like can be listed.

Figure 7:
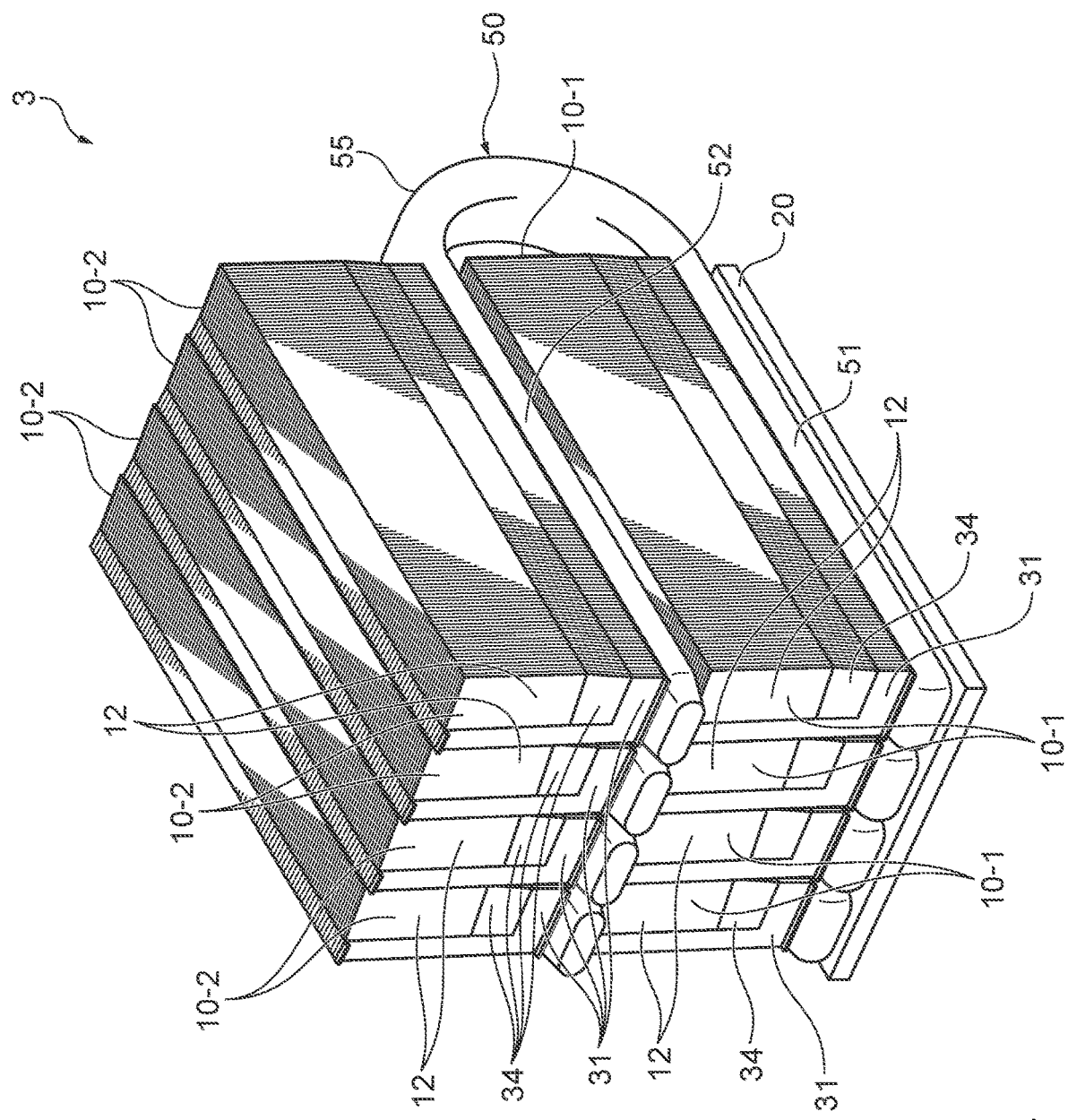
FIG. 7 is a perspective view of a heat sink according to a third embodiment of the present disclosure.
Figure 8:
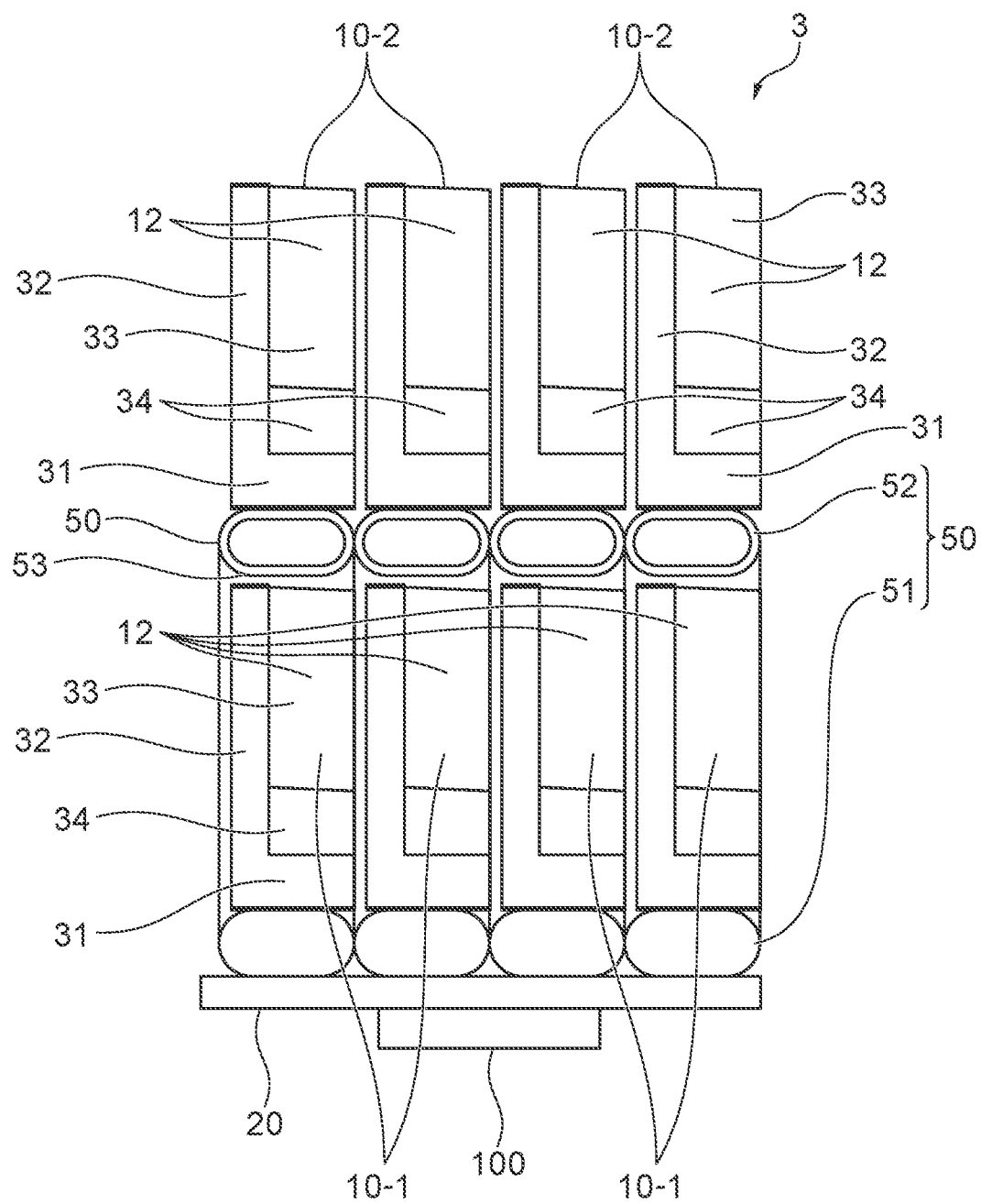
FIG. 8 is a front view of the heat sink according to the third embodiment of the present disclosure.
Figure 9:
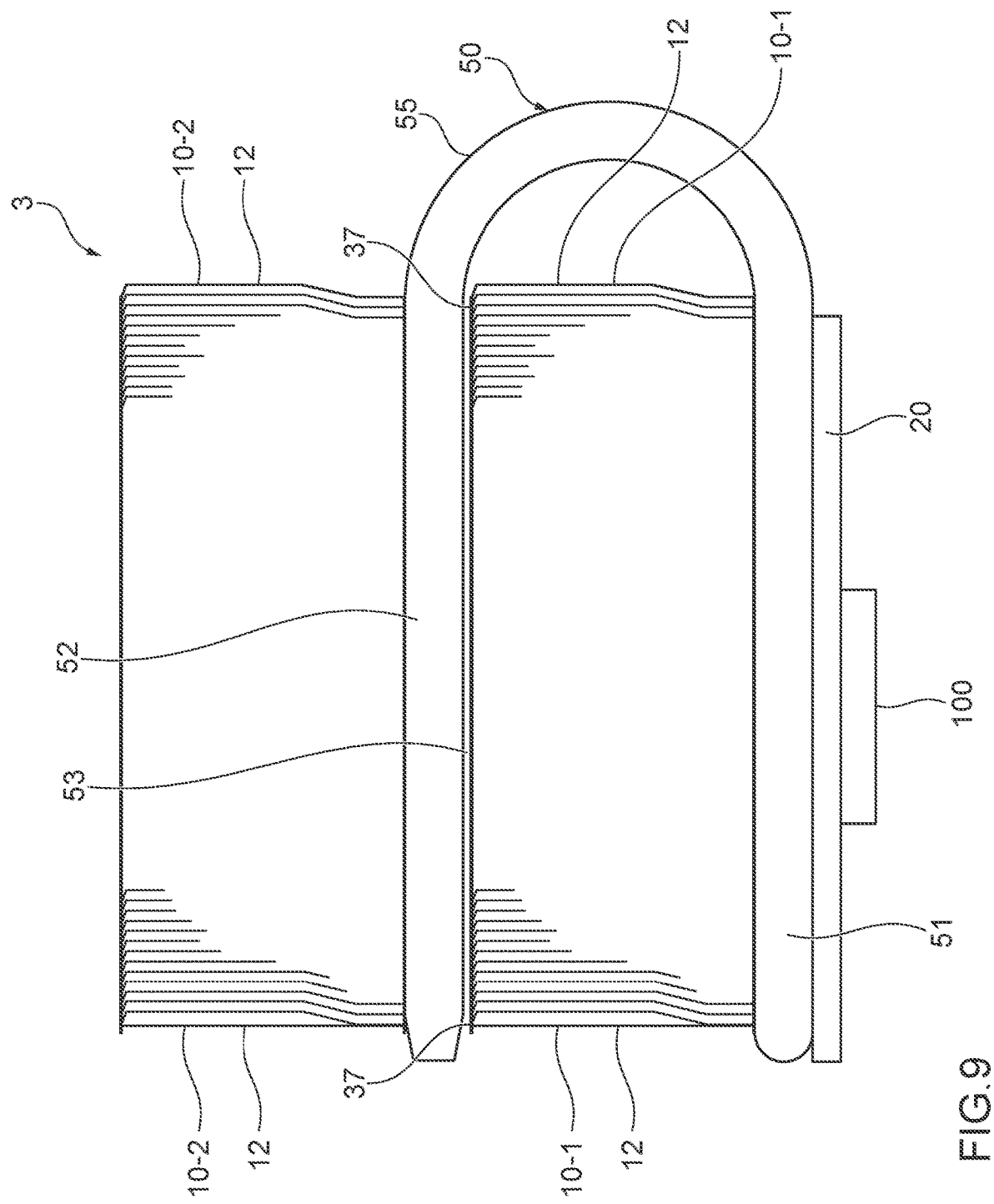
FIG. 9 is a side view of the heat sink according to the third embodiment of the present disclosure.

Next, a heat sink according to a third embodiment of the present disclosure will be described with reference to the accompanying drawings. The heat sink according to the third embodiment is in common with the heat sinks according to the first and second embodiments in terms of main components, and hence the same components as those of the heat sinks according to the first and second embodiments are described with use of the same reference characters. FIG. 7 is a perspective view of the heat sink according to the third embodiment of the present disclosure. FIG. 8 is a front view of the heat sink according to the third embodiment of the present disclosure. FIG. 9 is a side view of the heat sink according to the third embodiment of the present disclosure.

In the heat sinks 1, 2 according to the first and second embodiments described above, the radiating fins 10 are thermally connected to the base plate 20 as a result of the radiating fins 10 being directly attached to the main front surface 21 of the base plate 20. Instead, as illustrated in FIGS. 7 to 9, in a heat sink 3 according to the third embodiment, the radiating fin 10 is thermally connected to the base plate 20 via a heat transportation member 50.

The heat transportation member 50 has a container 55, a wick structure (not shown) accommodated in the container 55, a working fluid (not shown) encapsulated in the container 55, and a vapor flow path (not shown) that is an inner space of the container 55. The inner portion of the container 55 is airtight and is depressurized by deaeration processing.

As illustrated in FIGS. 7 to 9, in the heat sink 3, a multistage structure having a first radiating fin 10-1 having the same structure as the radiating fin 10 described above, and a second radiating fin 10-2 stacked on the first radiating fin 10-1 in the height direction of the first radiating fin 10-1 and having the same structure as the radiating fin 10 described above is provided. The heat transportation member 50 has a U-like shape in side view, and the first radiating fin 10-1 is thermally connected to the base plate 20 via a first section 51 of the heat transportation member 50. The second radiating fin 10-2 is thermally connected to a second section 52 facing the first section 51 of the heat transportation member 50.

The plurality of first radiating fins 10-1, 10-1, 10-1 . . . are parallelly disposed in a direction substantially parallel to the extending direction of the main front surfaces 12 and such that the main front surfaces 12, 12, 12 . . . of the plurality of first radiating fins 10-1, 10-1 . . . are substantially on the same plane. The plurality of first radiating fins 10-1, 10-1, 10-1 . . . are parallelly disposed to substantially be on a straight line in a direction substantially orthogonal to the extending direction of the main front surfaces 12 of the plurality of first radiating fins 10-1, 10-1, 10-1 . . . . The plurality of second radiating fins 10-2, 10-2, 10-2 . . . are parallelly disposed in a direction substantially parallel to the extending direction of the main front surfaces 12 and such that the main front surfaces 12, 12, 12 . . . of the plurality of second radiating fins 10-2, 10-2, 10-2 . . . are substantially on the same plane. The plurality of second radiating fins 10-2, 10-2, 10-2 . . . are parallelly disposed to substantially be on a straight line in a direction substantially orthogonal to the extending direction of the main front surfaces 12 of the plurality of second radiating fins 10-2, 10-2, 10-2 . . . .

A gap portion 53 is formed between the fin tip portion 37 of the first radiating fin 10-1 and the second section 52 of the heat transportation member 50. As a result of the gap portion 53 being formed, heat transfer from the first radiating fin 10-1 to the second section 52 of the heat transportation member 50 is prevented, and hence heat transportation characteristics of the heat transportation member 50 improve.

In the heat transportation member 50, the first section 51 of the container 55 functions as an evaporation portion (heat receiving portion) by thermally connecting the base plate 20 to the first section 51, and the second section 52 different from the first section 51 functions as a condensation portion (heat dissipation portion) by thermally connecting the radiating fin 10 (radiating fin 10-2) that is a heat exchange unit to the second section 52. When heat is received from the heat-generating element 100 at the evaporation portion of the heat transportation member 50, the working fluid changes in phase from a liquid phase to a gas phase. The working fluid that has changed in phase to the gas phase flows from the evaporation portion to the condensation portion of the container 55 through the vapor flow path. As a result, heat from the heat-generating element 100 is transported from the evaporation portion to the condensation portion. The heat from the heat-generating element 100 transported from the evaporation portion to the condensation portion is released as latent heat as a result of the working fluid in the gas phase changing in phase to the liquid phase at the condensation portion on which the radiating fin 10 (radiating fin 10-2) that is the heat exchange unit is provided. The latent heat released at the condensation portion is released from the condensation portion to an external environment of the heat sink 3 by the radiating fin 10 (radiating fin 10-2) provided on the condensation portion. The working fluid that has changed in phase to the liquid phase at the condensation portion is recirculated to a heat insulating portion from the condensation portion by the capillarity of the wick structure. The first radiating fin 10-1 is thermally connected to the base plate 20 via the first section 51 that is the evaporation portion of the heat transportation member 50, and hence the first radiating fin 10-1 releases the heat transmitted from the base plate 20 to the external environment of the heat sink 3.

In the heat sink 3, the heat transportation member 50 is a heat pipe having a tubular container 55, and one end portion of the container 55 having a tubular shape is the first section 51, and another end portion of the container 55 having a tubular shape is the second section 52. The container 55 having a tubular shape is processed in a flattened manner, and a plurality of the heat pipes that are the heat transportation members 50 are parallelly disposed in the width direction of the radiating fin 10.

In the heat sink 3, an aspect in which the radiating fin 10 is divided into the first radiating fin 10-1 and the second radiating fin 10-2 in the height direction is provided, and the heat from the heat-generating element 100 is transported from the base plate 20 to the second radiating fin 10-2 by the heat transportation member 50. Therefore, the fin efficiency of the radiating fin 10 further improves.

Figure 10:
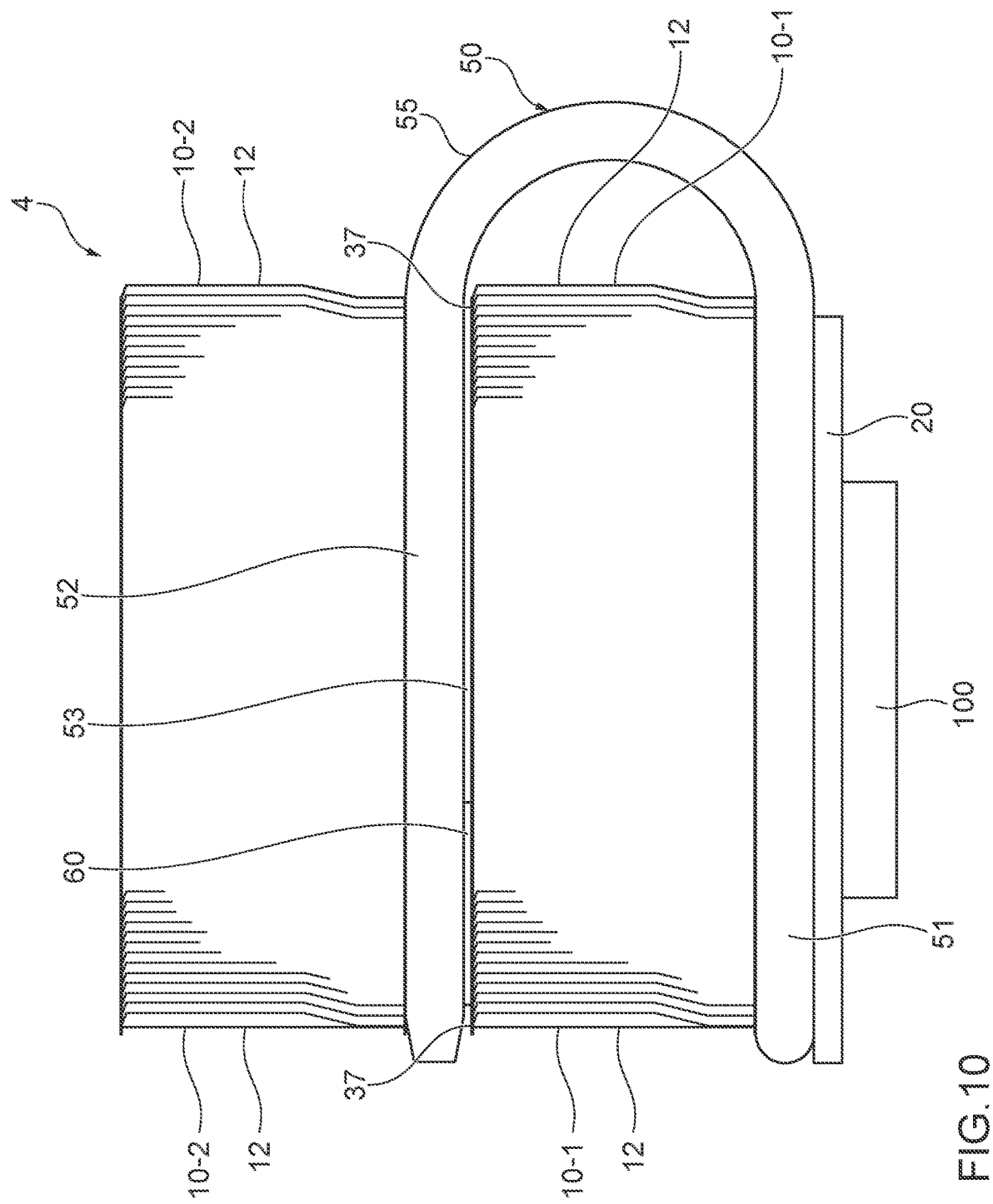
FIG. 10 is a side view of a heat sink according to a fourth embodiment of the present disclosure.

Next, a heat sink according to a fourth embodiment of the present disclosure will be described with reference to the accompanying drawings. The heat sink according to the fourth embodiment is in common with the heat sinks according to the first to third embodiments in terms of main components, and hence the same components as those of the heat sinks according to the first to third embodiments are described with use of the same reference characters. FIG. 10 is a side view of the heat sink according to the fourth embodiment of the present disclosure.

In the heat sink 3 according to the third embodiment, the gap portion 53 is formed between the fin tip portion 37 of the first radiating fin 10-1 and the second section 52 of the heat transportation member 50, and no member is inserted in the gap portion 53. However, as illustrated in FIG. 10, in a heat sink 4 according to the fourth embodiment, a heat insulating material 60 is interposed in the gap portion 53 formed between the fin tip portion 37 of the first radiating fin 10-1 and the second section 52 of the heat transportation member 50.

As the heat insulating material 60, for example, silicone rubber can be listed.

As a result of the heat insulating material 60 being interposed between the fin tip portion 37 of the first radiating fin 10-1 and the second section 52 of the heat transportation member 50, the condensation portion of the heat transportation member 50 can be prevented from rising in temperature by the first radiating fin 10-1, and the reduction of the temperature difference between the evaporation portion and the condensation portion of the heat transportation member 50 can be suppressed. Therefore, the heat transportation characteristics of the heat transportation member improve. As a result of the heat transportation characteristics of the heat transportation member 50 improving, the heat transportation from the first radiating fin 10-1 to the second radiating fin 10-2 is facilitated, and the fin efficiency of the radiating fin 10 further improves.

Figure 11:
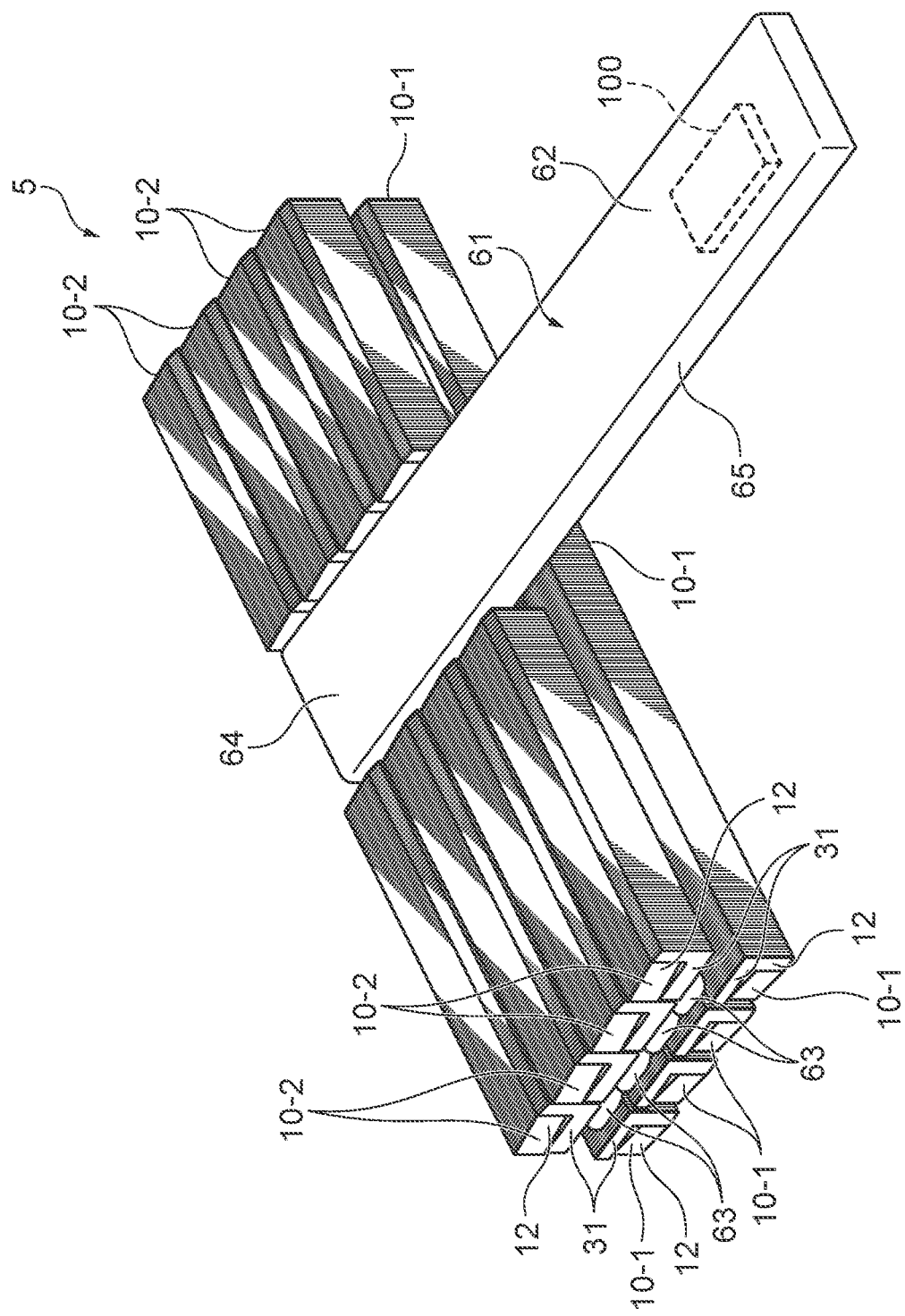
FIG. 11 is a perspective view of a heat sink according to a fifth embodiment of the present disclosure.

Next, a heat sink according to a fifth embodiment of the present disclosure will be described with reference to the accompanying drawings. The heat sink according to the fifth embodiment is in common with the heat sinks according to the first to fourth embodiments in terms of main components, and hence the same components as those of the heat sinks according to the first to fourth embodiments are described with use of the same reference characters. FIG. 11 is a perspective view of the heat sink according to the fifth embodiment of the present disclosure.

In the heat sinks 1, 2, 3, 4 according to the first to fourth embodiments, the base plate 20 is a thermally conductive member formed by a metal member. Instead, as illustrated in FIG. 11, in a heat sink 5 according to the fifth embodiment, a heat transportation member 61 instead of the metal member is used as the base plate that is a thermally conductive member.

The heat transportation member 61 that is the base plate of the heat sink 5 has a container 65, a wick structure (not shown) accommodated in the container 65, a working fluid (not shown) encapsulated in the container 65, and a vapor flow path (not shown) that is an inner space of the container 65. The inner portion of the container is airtight and is depressurized by deaeration processing.

As illustrated in FIG. 11, the heat sink 5 includes a heat transportation member 61 having a heat receiving portion 62 thermally connected to the heat-generating element 100, a plurality of radiating fins 10, 10, 10 . . . thermally connected to the heat transportation member 61, and tube bodies 63 thermally connected to the plurality of radiating fins 10, 10,

10 . . . . The plurality of radiating fins 10, 10, 10 . . . have the same structure as the radiating fins 10 described above. The plurality of radiating fins 10, 10, 10 . . . have a multistage structure having a plurality of first radiating fins 10-1, 10-1, 10-1 . . . , and a plurality of second radiating fins 10-2, 10-2, 10-2 . . . stacked on the first radiating fins 10-1 in the height direction of the first radiating fins 10-1 and having the same structure as the first radiating fins 10-1.

The plurality of first radiating fins 10-1, 10-1, 10-1 . . . are thermally connected to the tube bodies 63 as a result of each of the fin base portions 31 being attached to one surface of each of the tube bodies 63. In the plurality of first radiating fins 10-1, 10-1, 10-1 . . . , the plurality of first radiating fins 10-1, 10-1, 10-1 . . . in which each of the fin base portions 31 is attached to one surface of each of the tube bodies 63, and the plurality of first radiating fins 10-1, 10-1, 10-1 . . . in which the fin base portions 31 are attached to a heat dissipation portion 64 of the heat transportation member 61 exist. The plurality of first radiating fins 10-1, 10-1, 10-1 . . . are parallelly disposed along the stretching direction of the tube bodies 63.

The plurality of the second radiating fins 10-2, 10-2, 10-2 . . . are thermally connected to the tube bodies 63 as a result of the fin base portions 31 being attached to another surface of each of the tube bodies 63 opposite from one surface of each of the tube bodies 63. From the above, the plurality of the second radiating fins 10-2, 10-2, 10-2 . . . are disposed so as to face the plurality of first radiating fins 10-1, 10-1, 10-1 . . . . The plurality of second radiating fins 10-2, 10-2, 10-2 . . . are parallelly disposed along the stretching direction of the tube bodies 63.

The tube bodies 63 are attached to both sides of the container 65. The tube body 63 is connected to the heat transportation member 61 at the heat dissipation portion 64 of the heat transportation member 61. The heat transportation member 61 has an inner space which is integral, which communicates from the heat receiving portion 62 to a connecting portion to the tube body 63, and in which the working fluid is encapsulated. The inner space of the heat transportation member 61 communicates with the inner space of the tube body 63. In other words, in the heat sink 5, the inner space of the heat transportation member 61 and the inner space of the tube body 63 are an integral space, and the integral space is caused to be airtight and is depressurized by deaeration processing.

The stretching direction of the tube bodies 63 is a direction different from the heat transportation direction of the heat transportation member 61. In the heat sink 5, the stretching direction of the tube bodies 63 is a direction substantially orthogonal to the heat transportation direction of the heat transportation member 61.

In the heat sink 5, the heat-generating element 100 that is a body to be cooled is thermally connected to one end, for example, of the container 65 of the heat transportation member 61, and the one end of the container 65 is caused to function as the heat receiving portion 62. When the one end of the container 65 receives heat from the heat-generating element 100, the heat is transmitted to the working fluid in the liquid phase and the working fluid in the liquid phase changes in phase to the working fluid in the gas phase at the one end of the container 65. The working fluid in the gas phase is circulated from the heat receiving portion 62 of the container 65 to the heat dissipation portion 64 positioned on another end, for example, through a vapor flow path of the container 65. As a result of the working fluid in the gas phase being circulated from the one end to the other end of the container 65, the heat transportation member 61 transports heat from the one end to the other end. A part of the working fluid in the gas phase that has been circulated to the heat dissipation portion 64 of the container 65 changes in phase to a working fluid in the liquid phase by releasing latent heat, and the released latent heat is transmitted to the first radiating fins 10-1 attached to the heat transportation member 61. The heat transmitted to the first radiating fins 10-1 is released to an external environment of the heat sink 5 via the first radiating fins 10-1. The working fluid that has changed in phase to the liquid phase at the heat dissipation portion 64 of the container 65 is recirculated from the heat dissipation portion 64 of the container 65 to the heat receiving portion 62 of the container 65 by capillarity of the wick structure stored in the container 65.

The inner space of the container 65 and the inner spaces of the tube bodies 63 communicate with each other. Therefore, out of the working fluid in the gas phase that has changed in phase from the working fluid in the liquid phase at the heat receiving portion 62, the working fluid that has not changed in phase to the liquid phase at the heat dissipation portion 64 of the container 65 flows into the inner spaces of the tube bodies 63 from the inner space of the container 65. The working fluid in the gas phase that has flowed into the inner spaces of the tube bodies 63 releases latent heat in the tube bodies 63 and changes in phase to the working fluid in the liquid phase by a heat exchange function of the first radiating fins 10-1 and the second radiating fins 10-2. The latent heat released in the tube bodies 63 is transmitted to the first radiating fins 10-1 and the second radiating fins 10-2. The heat transmitted to the first radiating fins 10-1 and the second radiating fins 10-2 is released to the external environment of the heat sink 5 via the first radiating fins 10-1 and the second radiating fins 10-2. The working fluid that has changed in phase from the gas phase to the liquid phase in the inner spaces of the tube bodies 63 is recirculated to connecting portions between the tube bodies 63 and the container 65 from a central portion and a tip portion of the tube body 63 by capillarity of a wick structure (not shown) provided in the tube body 63. The working fluid in the liquid phase that has been recirculated to the connecting portions between the tube bodies 63 and the container 65 is recirculated to the wick structure stored in the container 65 at the heat dissipation portion 64 of the container 65. The working fluid in the liquid phase that has been recirculated to the wick structure stored in the container 65 is recirculated from the heat dissipation portion 64 of the container 65 to the heat receiving portion 62 of the container 65 by capillarity of the wick structure.

Figure 12:
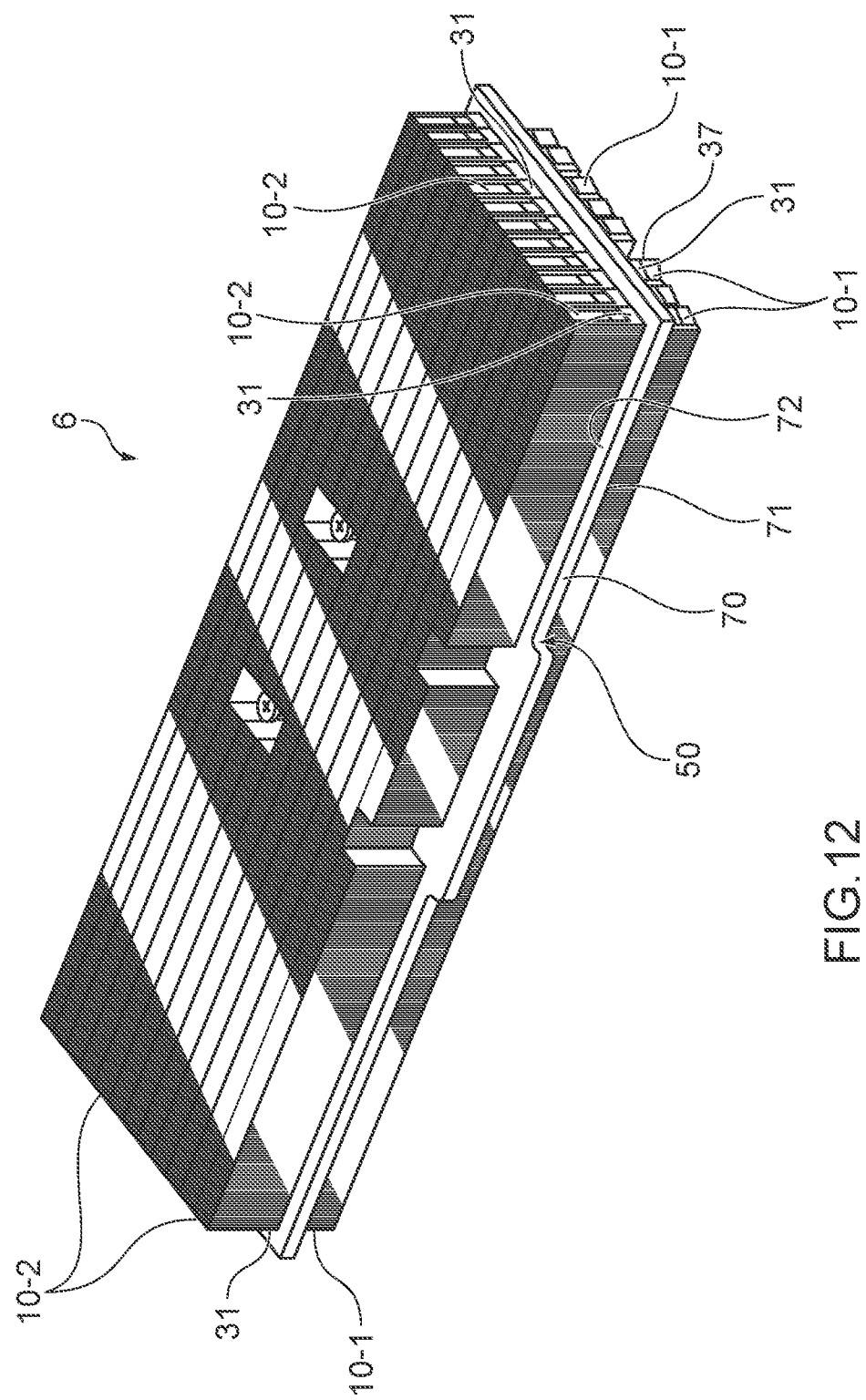
FIG. 12 is a perspective view of a heat sink according to a sixth embodiment of the present disclosure.

Next, a heat sink according to a sixth embodiment of the present disclosure will be described with reference to the accompanying drawings. The heat sink according to the sixth embodiment is in common with the heat sinks according to the first to fifth embodiments in terms of main components, and hence the same components as those of the heat sinks according to the first to fifth embodiments are described with use of the same reference characters. FIG. 12 is a perspective view of the heat sink according to the sixth embodiment of the present disclosure.

In the heat sink 3 according to the third embodiment, the heat transportation member 50 is a heat pipe having the container 55 having a tubular shape. Instead, as illustrated in FIG. 12, in a heat sink 6 according to the sixth embodiment, the heat transportation member 50 is a vapor chamber having a planar-surface-type container 70. In the heat sink 6, the heat transportation member 50 is used as a base plate that is a thermally conductive member. The planar-surface-type container 70 has a first main front surface 71 and a second main front surface 72 opposite from the first main front surface 71.

A multistage structure having the first radiating fin 10-1 having the same structure as the radiating fin 10 described above, and the second radiating fin 10-2 stacked on the first radiating fin 10-1 in the height direction of the first radiating fin 10-1 and having the same structure as the radiating fin 10 described above is provided in the heat sink 6 as well. The plurality of first radiating fins 10-1, 10-1, 10-1 . . . are thermally connected to the heat transportation member 50 as a result of the fin base portions 31 being attached to the first main front surface 71 of the heat transportation member 50. The plurality of first radiating fins 10-1, 10-1, 10-1 . . . are thermally connected to the heat transportation member 50 across the entirety of the first main front surface 71.

The plurality of second radiating fins 10-2, 10-2, 10-2 . . . are thermally connected to the heat transportation member 50 as a result of the fin base portions 31 being attached to the second main front surface 72 of the heat transportation member 50. The plurality of the second radiating fins 10-2, 10-2, 10-2 . . . are thermally connected to the heat transportation member 50 across the entirety of the second main front surface 72.

In the heat sink 6, the heat-generating element (not shown in FIG. 12) that is a body to be cooled is thermally connected to the first main front surface 71, for example, of the planar-surface-type container 70 of the heat transportation member and the first main front surface 71 of the planar-surface-type container 70 is caused to function as a heat receiving portion. The heat transmitted to the heat transportation member 50 from the heat-generating element is thermally diffused across the entire planar-surface-type container 70 by a heat transportation effect of the heat transportation member 50. The heat diffused across the entire planar-surface-type container 70 is transmitted to the first radiating fins 10-1 and the second radiating fins 10-2 from the heat transportation member 50, and the heat transmitted to the first radiating fins 10-1 and the second radiating fins 10-2 is released to an external environment of the heat sink 6 from the first radiating fins 10-1 and the second radiating fins 10-2.

Next, other embodiments of the heat sink of the present disclosure will be described. In the heat sink according to each embodiment described above, the bottom surface portion having a planar surface shape further extends from the bottom portion of the fin base portion. However, the bottom surface portion of the fin base portion does not necessarily need to be provided in accordance with conditions of use of the heat sink and the like. In the heat sink according to each embodiment described above, the plurality of radiating fins are disposed in an aligned manner, in other words, parallelly disposed in the direction substantially parallel to the extending direction of the main front surfaces of the plurality of radiating fins and such that the main front surfaces of the plurality of radiating fins are substantially on the same plane, the plurality of radiating fins are parallelly disposed to substantially be on a straight line in the direction substantially orthogonal to the extending direction of the main front surfaces of the plurality of radiating fins, and the main front surfaces of the plurality of radiating fins are disposed to line up to be substantially parallel to the main front surface of another adjacent radiating fin. However, the plurality of radiating fins may be disposed in an offset manner instead. As the disposal of the plurality of radiating fins in an offset manner, disposal in a staggered form in which adjacent radiating fins are installed in positions that form a triangle with each other, for example, can be listed.

In the heat sink of the present disclosure, excellent fin efficiency is obtainable by reducing the difference between the temperature of the fin base portion of the radiating fin and the average temperature of the radiating fin, turbulence is generatable in the cooling air, the increase of the pressure loss of the cooling air is preventable, and the decrease of the wind speed of the cooling air between the radiating fins is preventable in an environment in which the installation space of the heat sink is limited. Therefore, for example, the heat sink of the present disclosure has high utility value in a field of cooling electronic components with high heat generation amount installed on a circuit substrate installed in a narrow space, for example, electronic components of a central processing unit and the like.

What is claimed is:

1. A heat sink comprising:
   a base plate thermally connected to a heat-generating element; and
   a plurality of plate-like radiating fins erected on a main front surface of the base plate at a predetermined erection angle $\theta 1$ with respect to an extending direction of the main front surface of the base plate and thermally connected to the base plate, wherein each of the plurality of plate-like radiating fins has:
     a fin base portion that is a planar surface portion that extends from one end to another end in a width direction of the radiating fin along the main front surface of the base plate and is positioned on the base plate side;
     a perpendicular portion that is a planar surface portion that extends from one end of the fin base portion to a fin tip portion of the radiating fin in a height direction on a same plane as the fin base portion;
     an inclined portion that is a planar surface portion that extends from the perpendicular portion to the other end of the radiating fin at a predetermined inclination angle $\theta 2$ with respect to the fin base portion and the perpendicular portion and extends from the fin tip portion to a fin intermediate portion between the fin tip portion and the fin base portion; and
     a twisted portion that is a planar surface portion that connects the fin base portion, the perpendicular portion, and the inclined portion to each other.

2. The heat sink according to claim 1, wherein the predetermined inclination angle $\theta 2$ is 2.0 degrees or more and 20 degrees or less.

3. The heat sink according to claim 2, wherein the predetermined erection angle $\theta 1$ of the fin base portion is 70 degrees or more and 90 degrees or less.

4. The heat sink according to claim 2, wherein a top surface portion having a planar surface shape further extends from the fin tip portion in the perpendicular portion.

5. The heat sink according to claim 4, wherein a top surface of a radiating fin group formed by the plurality of radiating fins has an opening portion as a result of the top surface portion abutting against the fin tip portion of another adjacent one of the radiating fins.

6. The heat sink according to claim 2, wherein a bottom surface portion having a planar surface shape further extends from a bottom portion of the fin base portion.

7. The heat sink according to claim 1, wherein a top surface portion having a planar surface shape further extends from the fin tip portion in the perpendicular portion.

8. The heat sink according to claim 7, wherein a top surface of a radiating fin group formed by the plurality of radiating fins has an opening portion as a result of the top surface portion abutting against the fin tip portion of another adjacent one of the radiating fins.

9. The heat sink according to claim 1, wherein the base plate is a thermally conductive member.

10. The heat sink according to claim 1, wherein the base plate is a thermally conductive member formed by a heat transportation member.

11. The heat sink according to claim 1, wherein the radiating fin includes a multistage structure having a first radiating fin, and a second radiating fin stacked on the first radiating fin in a height direction of the first radiating fin, the first radiating fin is thermally connected to the base plate via a heat transportation member, and the second radiating fin is thermally connected to the heat transportation member, wherein the heat transportation member is a heat pipe having a tubular container or a vapor chamber having a planar-surface-type container.

12. The heat sink according to claim 11, wherein a gap portion is formed between a fin tip portion of the first radiating fin and the heat transportation member.

13. The heat sink according to claim 11, wherein a heat insulating material is interposed between a fin tip portion of the first radiating fin and the heat transportation member.

14. The heat sink according to claim 1, wherein the predetermined erection angle $\theta 1$ of the fin base portion is 70 degrees or more and 90 degrees or less.

15. The heat sink according to claim 1, wherein a bottom surface portion having a planar surface shape further extends from a bottom portion of the fin base portion.

16. The heat sink according to claim 1, wherein a height of the fin base portion with respect to a height of the radiating fin is 5.0% or more and 40% or less.

17. The heat sink according to claim 1, wherein a width of the twisted portion with respect to a width of the radiating fin is 50% or more and 90% or less.

18. The heat sink according to claim 1, wherein a plurality of the radiating fins are disposed along a width direction of the fin base portion, and one end of the fin base portion contacts another end of the fin base portion of the adjacent radiating fin via a joining portion.

19. The heat sink according to claim 1, wherein cooling air is supplied from a perpendicular portion side along the width direction of the radiating fin.

* * * * *